United States Patent
Chang et al.

(10) Patent No.: US 8,958,232 B2
(45) Date of Patent: Feb. 17, 2015

(54) METHOD AND APPARATUS FOR READ ASSIST TO COMPENSATE FOR WEAK BIT

(75) Inventors: Jonathan Tsung-Yung Chang, Hsinchu (TW); Cheng Hung Lee, Hsinchu (TW); Chung-Cheng Chou, Hsin-Chu (TW); Hung-Jen Liao, Hsin-Chu (TW); Bin-Hau Lo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 491 days.

(21) Appl. No.: 13/437,081

(22) Filed: Apr. 2, 2012

(65) Prior Publication Data

US 2013/0258747 A1   Oct. 3, 2013

(51) Int. Cl.
*G11C 17/00* (2006.01)

(52) U.S. Cl.
USPC ............ 365/94; 365/189.15; 365/189.07; 365/189.08; 365/207; 365/154

(58) Field of Classification Search
CPC .. G11C 11/419; G11C 11/417; G11C 29/025; G11C 7/12; G11C 7/06; G11C 7/065
USPC ............ 365/94, 189.15, 189.07, 189.08, 207, 365/154
See application file for complete search history.

(56) References Cited

U.S. PATENT DOCUMENTS

| | | | | |
|---|---|---|---|---|
| 5,034,923 A | * | 7/1991 | Kuo et al. | 365/189.16 |
| 5,091,879 A | * | 2/1992 | Tran | 365/177 |
| 5,396,457 A | * | 3/1995 | Vinal | 365/189.15 |
| 5,428,574 A | * | 6/1995 | Kuo et al. | 365/201 |
| 6,574,159 B2 | * | 6/2003 | Ohbayashi et al. | 365/201 |
| 6,975,532 B1 | | 12/2005 | Kosonocky et al. | |
| 7,177,177 B2 | | 2/2007 | Chuang et al. | |
| 7,755,937 B2 | * | 7/2010 | Kitagawa | 365/180 |
| 8,164,962 B2 | * | 4/2012 | Takeda | 365/191 |
| 8,547,723 B2 | * | 10/2013 | Tanaka et al. | 365/72 |
| 2013/0010544 A1 | * | 1/2013 | Lin et al. | 365/189.05 |
| 2014/0016391 A1 | * | 1/2014 | Tanaka et al. | 365/72 |
| 2014/0269091 A1 | * | 9/2014 | Zheng et al. | 365/185.21 |

OTHER PUBLICATIONS

Zhang, K.J. et al., "A research of Dual-Port Sram cell using 8T", 2010 10th IEEE International Conference on Solid State and Integrated Circuit Technology, Nov. 2010, pp. 2040-2042.

* cited by examiner

*Primary Examiner* — Tuan T Nguyen
(74) *Attorney, Agent, or Firm* — Duane Morris LLP

(57) ABSTRACT

A memory assist apparatus includes a detection circuit and a compensation circuit. The detection circuit is configured to provide a detection signal indicating whether a bit line configured to provide read access to a data bit stored at a memory bit cell has a voltage below a predetermined threshold. The compensation circuit is configured to pull down the voltage of the bit line if the detection signal indicates that the voltage of the bit line is below the predetermined threshold.

20 Claims, 4 Drawing Sheets

US 8,958,232 B2

METHOD AND APPARATUS FOR READ ASSIST TO COMPENSATE FOR WEAK BIT

BACKGROUND

In various types of memory devices, one or more bit lines are used to access memory bit cells. In some memory configurations, during a read operation, a bit line coupled to a bit cell is used to obtain the logic value of a data bit stored at the bit cell. A bit line is precharged to a predetermined voltage (e.g., corresponding to a logical high value), and a word line is asserted. The bit line settles to a value indicative of a data bit stored at the bit cell. In some instances, the bit line is pulled down towards a logical low voltage value (e.g., logical '0') at a relatively slow rate. A weak (relatively slow) transition of the bit line from '1' to '0' is sometimes referred to as a "weak bit" issue and results from process variation. When considering the 6σ (six standard deviations from mean) time for the bit line to settle at '0' during a read operation, a variation in settling time greater than 50% has been observed. The weak bit issue negatively impacts memory access time and performance of various circuit applications.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
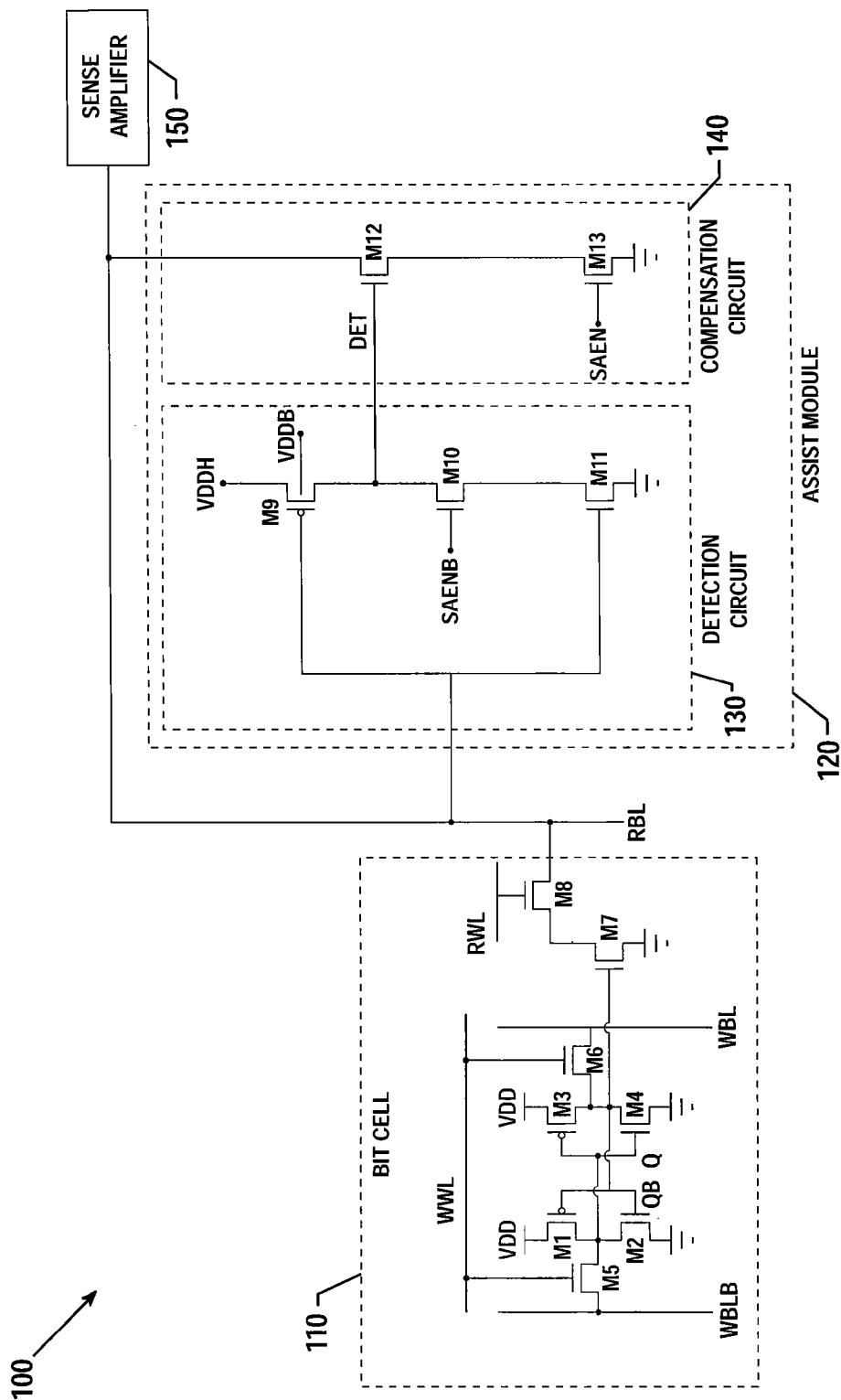
FIG. 1 is a schematic diagram of a memory in accordance with some embodiments of the present disclosure.

FIG. 1 is a schematic diagram of a memory apparatus 100 in accordance with some embodiments of the present disclosure. A bit cell 110 may be a bit cell of various types of memory employing a bit line for a read operation, e.g., various types of read only memory (ROM) and static random access memory (SRAM) such as six-transistor (6T), eight-transistor (8T), and ten-transistor (10T) SRAM configurations known to one of ordinary skill in the art. In FIG. 1, an 8T SRAM bit cell in a configuration referred to as "one-write-one-read" or "1W1R" is shown. An 8T SRAM bit cell such as bit cell 110 has two sets of data and address paths (i.e., this bit cell is a dual-port memory bit cell). In the 1W1R configuration, the bit cell has one port dedicated to write operations and one port dedicated to read operations (hence the term "1W1R"). Additional description of various types of SRAM bit cells including 1W1R 8T SRAM bit cells is found at "A research of Dual-Port SRAM cell using 8T," by Kai-ji Zhang et al., 2010 10$^{th}$ IEEE International Conference on Solid-State and Integrated Circuit Technology (ICSICT), Nov. 1-4, 2010, pp. 2040-0242, which is hereby incorporated by reference herein in its entirety.

Bit cell 110 includes a pair of cross-coupled inverters formed by transistors M1, M2, M3, and M4, a logic state of which corresponds to a stored data bit. Access transistors M5 and M6 provide access to bit lines WBL and WBLB for writing under the control of a write word line WWL. Transistors M7 and M8 and read bit line RBL provide read access to the bit cell when a read word line RWL is asserted. In the following discussion, the read bit line RBL coupled to 8T SRAM bit cell 110 is discussed, but a read bit line of various types of memory bit cells may be used in embodiments of the present disclosure.

Bit line RBL is coupled to a sense amplifier that enables a signal from the bit line to be sensed and amplified for a memory read operation according to various techniques. As discussed above, bit line RBL exhibits the weak bit issue and transitions from a precharged logical high '1' state towards a logical low '0' state relatively slowly. An assist module 120 addresses the weak bit issue with a detection circuit 130 and a compensation circuit 140. Detection circuit 130 detects the weak bit issue and provides a detection signal DET indicating whether bit line RBL has a voltage below a predetermined threshold, such as a threshold voltage for transistors M9 and M11 of detection circuit 130. Based on the resulting detection signal DET, compensation circuit 140 compensates for the weak bit at bit line RBL by pulling RBL down towards ground ('0'). With the pull-down functionality provided by compensation circuit 140 responsive to the detection of the weak bit by detection circuit 130, read speed and/or a read margin is improved. Additionally, for a given speed, the minimum power supply voltage Vccmin for a read access is decreased, e.g., from 1V to 0.9V for a 1 GHz access rate.

Detection circuit 130 includes PMOS transistor M9 and NMOS transistor M11 having respective gate terminals coupled to bit line RBL. In some embodiments, an NMOS transistor M10 is coupled between transistors M9 and M11 as shown in FIG. 1. If transistor M10 is not provided, transistors M9 and M11 function as an inverter having RBL as an input and providing detection signal DET at an output. If RBL is high, NMOS transistor M11 is turned on, pulling DET down to ground; if RBL is low, PMOS transistor M9 is turned on, pulling DET up to $V_{DDH}$. If transistor M10 is provided, that transistor cuts off a path for pulling down DET, based on a signal SAENB described further below. A source terminal of PMOS transistor M9 is tied to a voltage $V_{DDH}$, which is greater than or equal to a power supply voltage $V_{DD}$ that powers bit cell 110. In some embodiments $V_{DDH}$ is more than 50 mV higher than $V_{DD}$. A body terminal of PMOS transistor M9 is tied to a voltage $V_{DDB}$, which is less than or equal to $V_{DD}$. In some embodiments $V_{DDB}$ is more than 50 mV less than $V_{DD}$. In various embodiments, $V_{DDH}$ and $V_{DDB}$ are generated by a charge pump or are provided by a voltage regulator. The turn-on threshold voltage $V_{th}$ for transistor M9 is tunable by increasing the source voltage VDDH and/or decreasing the body voltage VDDB. By tuning $V_{th}$ of transistor M9, device speed is increased, which is advantageous due to the weak bit at bit line RBL. In other words, detecting the weak bit quickly based on tuning of M9 enables the weak bit to be addressed quickly.

Sense amplifier 150 is enabled by an enable signal SAEN, which has a logical complement signal SAENB. When SAEN is asserted for a read operation, SAENB is low. In a weak bit situation, in which RBL was initially precharged to the '1' voltage value and is falling towards '0' relatively slowly, the voltage at RBL falls below a threshold that turns on PMOS transistor M9 and turns off NMOS transistor M11. M10 is off due to SAENB being low. Due to transistor M9 being turned on, DET is pulled high to $V_{DDH}$ at the source of PMOS transistor M9. DET provides to compensation circuit 140 an indication of the weak bit at RBL, and this indication causes the compensation circuit to pull down RBL to speed up the decrease of the voltage at that bit line.

Compensation circuit 140 includes at least NMOS transistor M12 that has a gate biased by signal DET. In some embodiments, compensation circuit 140 also includes an NMOS transistor M13 in a cascade configuration with M12 as shown, with the gate of M13 biased by SAEN. With DET asserted, indicating that RBL is low, transistor M12 is turned on; with SAEN also asserted during the read operation, the path to ground provided by transistors M12 and M13 results in RBL being pulled down to '0'. Thus, compensation circuit 140 pulls down RBL to '0' to speed up the read operation.

Figure 2:
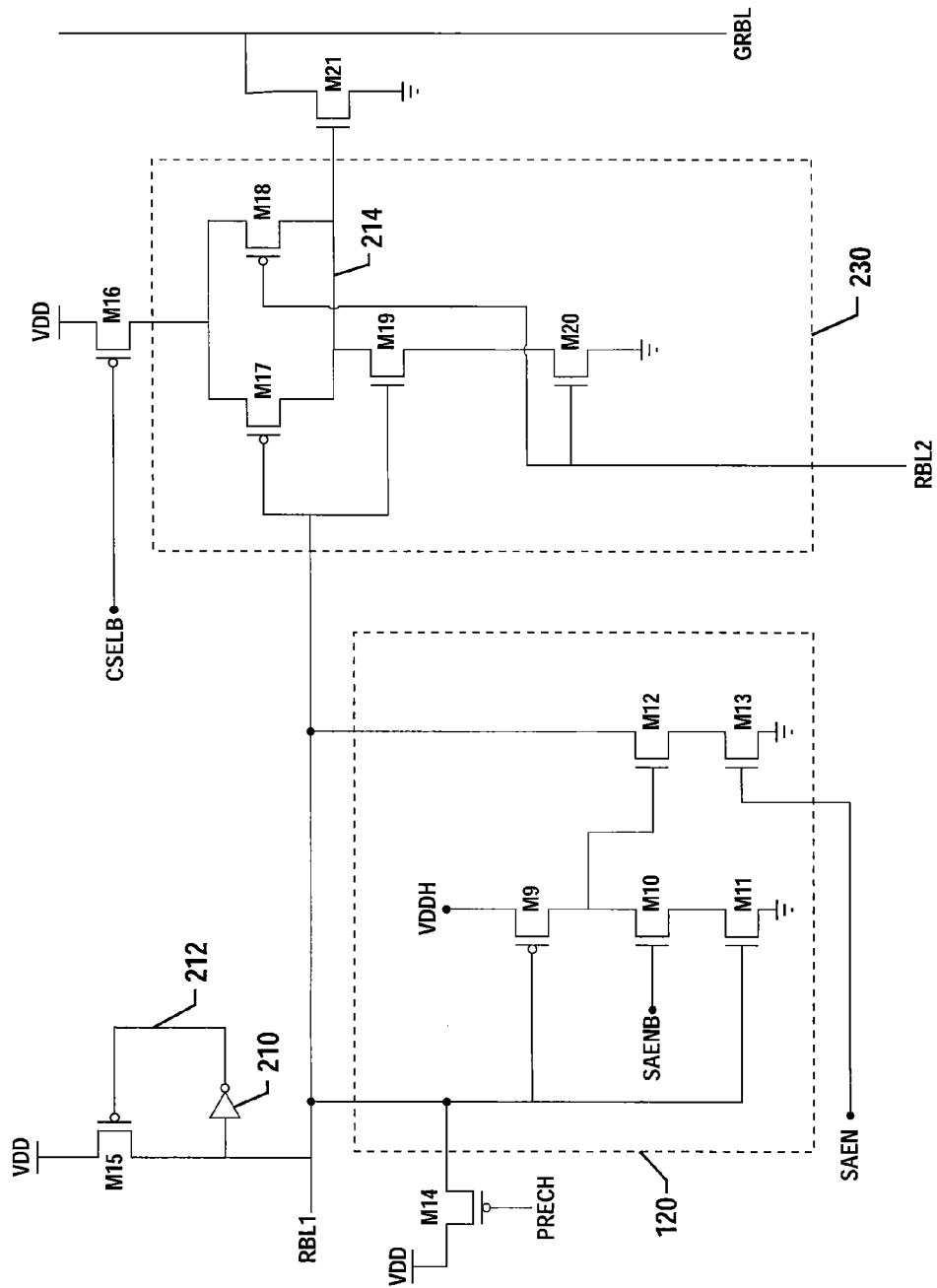
FIG. 2 is a schematic diagram illustrating a memory assist module in an example implementation with two local read bit lines in accordance with some embodiments.

FIG. 2 is a schematic diagram illustrating a memory assist module in an example implementation with two local read bit lines in accordance with some embodiments. Memory assist module 120 of FIG. 2 is similar to the assist module of FIG. 1 and does not require further explanation.

Although a single read bit line (e.g., bit line RBL of FIG. 1) may be connected to all bit cells in a memory, in some embodiments a pair of bit lines RBL1 and RBL2 are provided to reduce bit line loading. For example, in some embodiments a single bit line is connected to an array of 1024 bit cells (or some other large number of bit cells), but providing a first local bit line RBL1 to service one set of 512 bit cells and a second local bit line RBL2 to service another set of 512 bit cells, along with a global bit line described further below, improves performance, e.g., speeding up memory access. Bit line RBL1 is precharged high by asserting low signal PRECH, which turns on PMOS transistor M14, thereby pulling RBL1 high to voltage $V_{DD}$ at the source of PMOS transistor M14. Inverter 210 provides a low voltage at node 212, which turns on transistor M15, keeping node RBL1 high. For example, when transistor M15 is on, RBL1 is pulled to voltage $V_{DD}$ at the source of transistor M15.

Select signal CSELB supports selection of one of the local bit lines using a NAND logic circuit (NAND gate) as follows. If CSELB is asserted low, PMOS transistor M16 is turned on and provides power (voltage $V_{DD}$) to NAND circuit 230. The implementation of NAND circuit 230 is known, and other implementations may be used as well. For a read operation, local bit lines RBL1 and RBL2 and global read bit line GRBL are all precharged high. Suppose the data bit to be read from one of the bit cells is '1'. Then local bit lines RBL1 and RBL2 remain high from the precharged state. PMOS transistors M17 and M18 are turned off. NMOS transistors M19 and M20 are turned on, pulling the voltage at node 214 to a low logical value at the source of NMOS transistor M20. Node 214 is the output node of NAND circuit 230. The '0' logical voltage at node 214 turns off transistor M21, which prevents global read bit line GRBL from being pulled down by NMOS transistor M21. In effect, when the NAND output node 214 is '0', a sense amplifier comprising transistors M17, M18, M19, M20, and M21 is bypassed, as the global bit line GRBL that was precharged high will directly provide a '1'. If the data bit to be read from one of the bit cells is '0', one of the local bit lines RBL1 or RBL2 is selected and pulled down, and the output node 214 of NAND circuit 230 is '1'. That turns on NMOS transistor M21, pulling down global read bit line GRBL.

Figure 3:
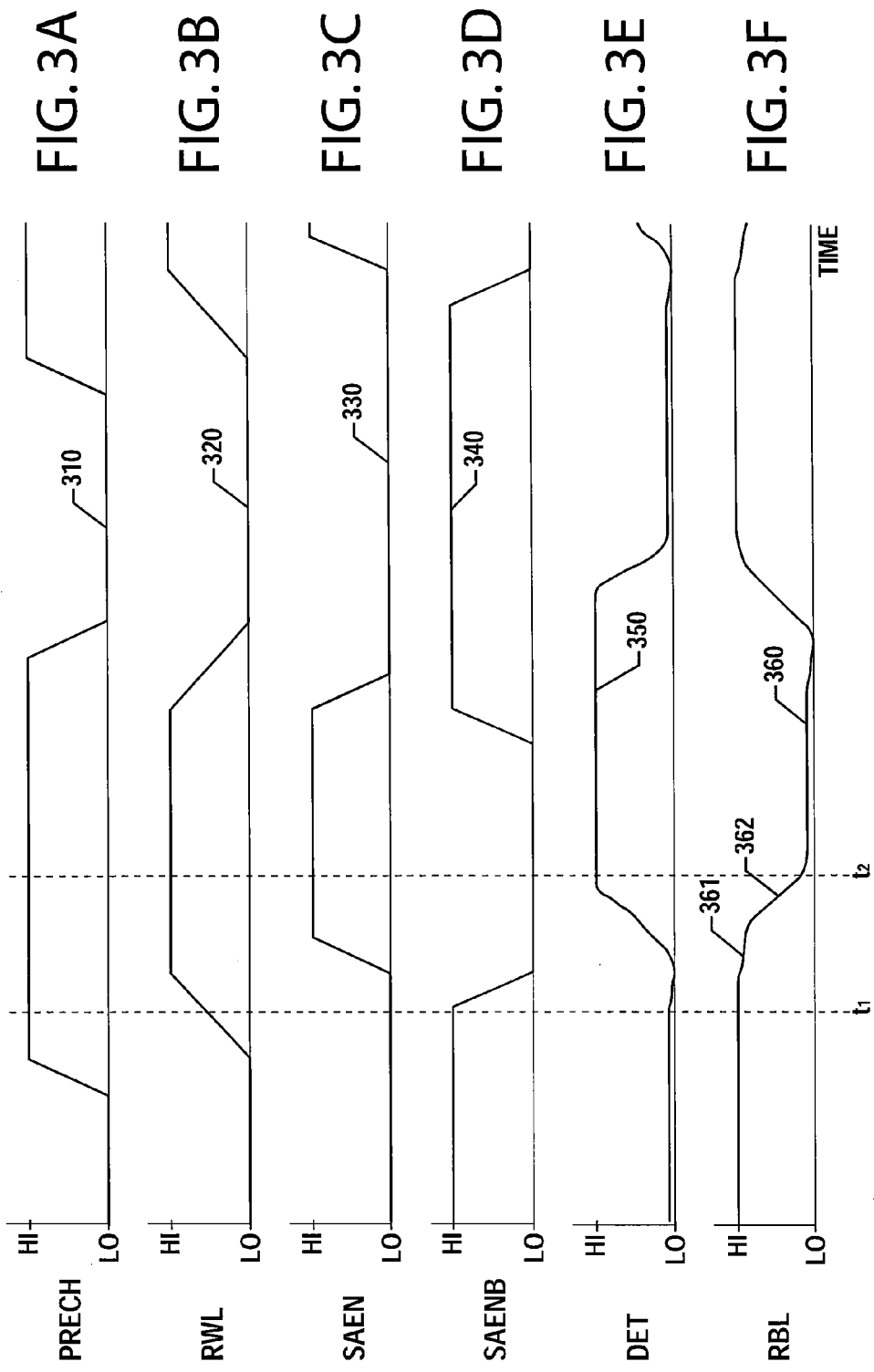
FIGS. 3A-3F are plots of various circuit signals in accordance with some embodiments.

FIGS. 3A-3F are plots of various signals related to the circuits of FIGS. 1 and 2 in accordance with some embodiments. In FIG. 3A, plot 310 is a trace of signal PRECH that precharges a bit line. Initially, PRECH is low, and PMOS transistor M14 conducts current between its source and drain terminals, charging bit line RBL1. During the read operation, PRECH is set to '1', which turns off PMOS transistor M14.

In FIG. 3B, plot 320 is a trace of the voltage at read word line RWL. Signal RWL is asserted for the read operation. In some embodiments, time t1 corresponds to a time at which RWL is halfway between the '0' and '1' logical values, and the read operation is considered to begin at this time. Time t2 corresponds to a time at which a data bit that has been read from a bit cell is available for use by other circuit components.

In FIGS. 3C-3D, plots 330 and 340 are traces of sense enable signal SAEN and its complement SAENB, respectively. When SAEN transitions high, transistor M13 turns on; when SAEN transitions low, M13 turns off. When SAENB transitions high, transistor M10 turns on; when SAENB transitions low, M10 turns off.

In FIG. 3E, plot 350 is a trace of signal DET that indicates that RBL is to be pulled down by compensation circuit 240. When DET is low, transistor M12 is off, and RBL is not pulled down to ground. When DET and SAEN are high, transistors M12 and M13 provide a path for pulling RBL down to ground.

In FIG. 3F, plot 360 is a trace of the voltage at bit line RBL. The plot becomes steeper (slope has higher magnitude) when the compensation circuit 140 begins to pull down RBL. For example, after DET and SAEN turn on transistors M12 and M13, respectively, the slope of the plot is higher in magnitude at point 362 than it was at point 361.

Figure 4:
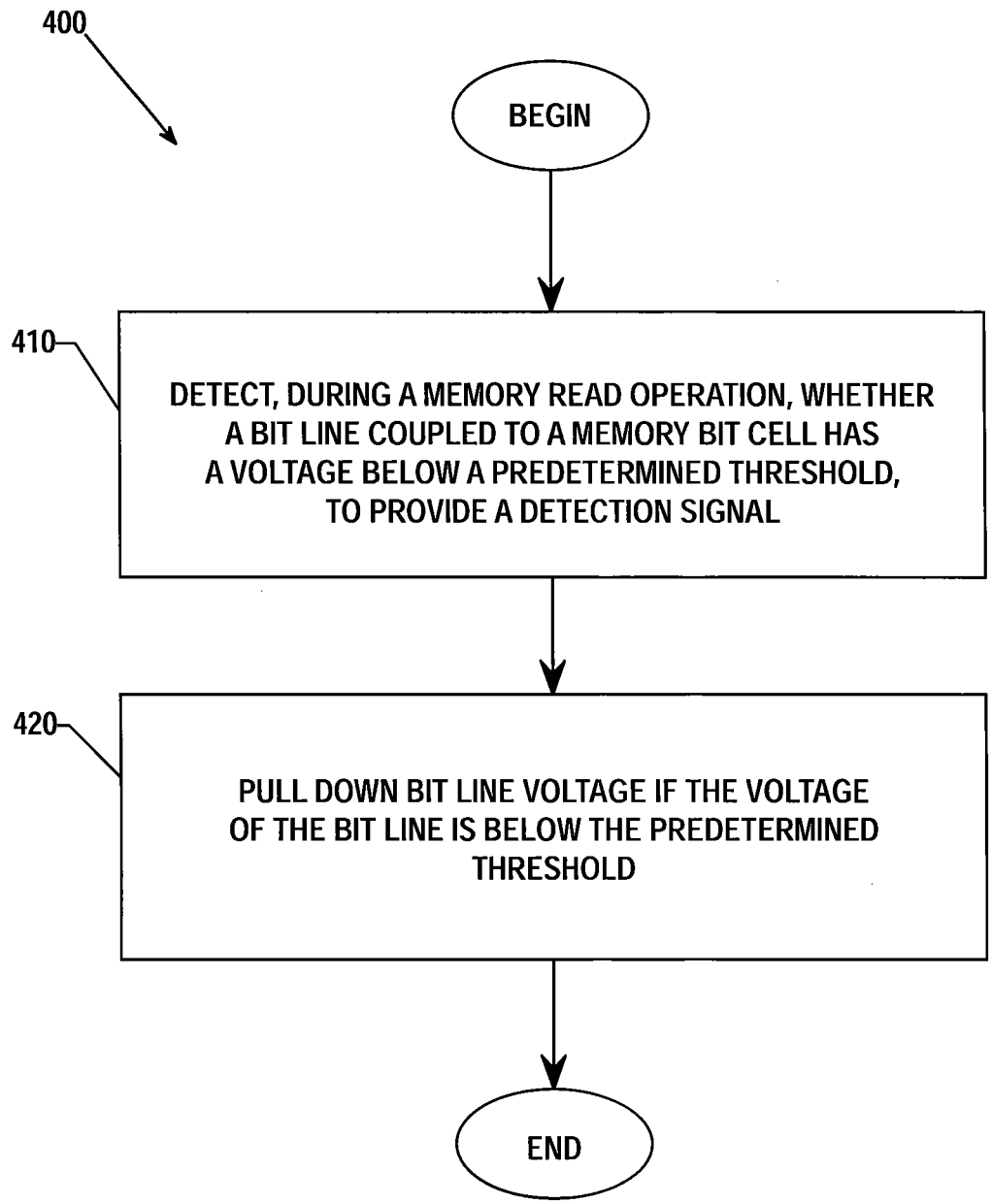
FIG. 4 is a flow diagram of a process in accordance with some embodiments.

FIG. 4 is a flow diagram of a process in accordance with some embodiments. After process 400 begins, the process includes detecting (410), during a memory read operation, whether a bit line (e.g., RBL) coupled to a memory bit cell (e.g., bit cell 110) has a voltage below a predetermined threshold, to provide a detection signal DET. In some embodiments, the predetermined threshold is a voltage at which PMOS transistor M9 and NMOS transistor M11 are turned on. The voltage of the bit line is pulled down (420) during the memory read operation if the detection signal indicates that the voltage of the bit line is below the predetermined threshold.

In some embodiments, a memory assist apparatus (e.g., assist module 120) includes a detection circuit (e.g., circuit 130) and a compensation circuit (e.g., circuit 140). The detection circuit is configured to provide a detection signal (e.g., signal DET) indicating whether a bit line (e.g., RBL) configured to provide read access to a data bit stored at a memory bit cell (e.g., bit cell 110) has a voltage below a predetermined threshold, which in some embodiments is a threshold voltage of PMOS transistor M9 and NMOS transistor M11. The compensation circuit is configured to pull down the voltage of the bit line if the detection signal indicates that the voltage of the bit line is below the predetermined threshold.

In some embodiments, a method of assisting a memory read operation includes detecting, during a memory read operation, whether a bit line coupled to a memory bit cell has a voltage below a predetermined threshold, to provide a detection signal. The voltage of the bit line is pulled down during the memory read operation if the detection signal indicates that the voltage of the bit line is below the predetermined threshold.

In some embodiments, a memory includes a memory bit cell (e.g., bit cell 110), a bit line (e.g., bit line RBL), an assist module (e.g., assist module 120), and a sense amplifier (e.g., sense amplifier 150). The bit line is coupled to the bit cell and is configured to provide read access to a data bit stored at the bit cell. The assist module includes a PMOS transistor (e.g., transistor M9) and first, second, third, and fourth NMOS transistors (e.g., transistors M11, M10, M12, and M13, respectively). The PMOS transistor has a gate terminal coupled to the bit line, and a source terminal coupled to an assist module power supply node. The first NMOS transistor has a gate terminal coupled to the bit line, and a source terminal coupled to a ground node. The second NMOS transistor is coupled between the PMOS transistor and the first NMOS transistor. The third NMOS transistor has a gate terminal coupled to a drain terminal of the PMOS transistor, and a drain terminal coupled to the bit line. The fourth NMOS transistor has a source terminal coupled to the ground node, and a drain terminal coupled to a source terminal of the third NMOS transistor. The sense amplifier is coupled to the bit line and is enabled by assertion of a sense enable signal (e.g., signal SAEN). The fourth NMOS transistor is biased by the sense enable signal, and the second NMOS transistor is biased by a signal (e.g., signal SAENB) complementary to the sense enable signal.

Although examples are illustrated and described herein, embodiments are nevertheless not limited to the details shown, since various modifications and structural changes may be made therein by those of ordinary skill within the scope and range of equivalents of the claims.

What is claimed is:

1. A memory assist apparatus comprising:
   a detection circuit configured to provide a detection signal indicating whether a bit line configured to provide read access to a data bit stored at a memory bit cell has a voltage below a predetermined threshold; and
   a compensation circuit configured to pull down the voltage of the bit line if the detection signal indicates that the voltage of the bit line is below the predetermined threshold.

2. The memory assist apparatus of claim 1, wherein the detection circuit includes a PMOS transistor and a first NMOS transistor, a gate of the PMOS transistor and a gate of the first NMOS transistor are coupled to the bit line, and a drain terminal of the PMOS transistor is coupled to an input node of the compensation circuit.

3. The memory assist apparatus of claim 2, wherein the detection circuit further includes a second NMOS transistor coupled between the PMOS transistor and the first NMOS transistor.

4. The memory assist apparatus of claim 3, further comprising a sense amplifier coupled to the bit line, wherein the sense amplifier is enabled by assertion of a sense enable signal, and the second NMOS transistor is biased by a signal complementary to the sense enable signal.

5. The memory assist apparatus of claim 2, wherein the bit cell is powered by a power supply voltage, and a source terminal of the PMOS transistor is coupled to a node having a voltage greater than or equal to the power supply voltage.

6. The memory assist apparatus of claim 2, wherein the bit cell is powered by a power supply voltage, and a body of the PMOS transistor is coupled to a node having a voltage less than or equal to the power supply voltage.

7. The memory assist apparatus of claim 1, wherein the compensation circuit includes a first NMOS transistor having a gate biased by the detection signal.

8. The memory assist apparatus of claim 7, wherein the compensation circuit further includes a second NMOS transistor in a cascade configuration with the first NMOS transistor.

9. The memory assist apparatus of claim 8, further comprising a sense amplifier coupled to the bit line, wherein the sense amplifier is enabled by assertion of a sense enable signal, and the second NMOS transistor is biased by the sense enable signal.

10. The memory assist apparatus of claim 1, wherein the bit cell is a read only memory (ROM) bit cell.

11. The memory assist apparatus of claim 1, wherein the bit cell is a static random access memory (SRAM) bit cell.

12. The memory assist apparatus of claim 11, wherein the bit cell is selected from the group consisting of a 6T SRAM bit cell, an 8T SRAM bit cell, and a 10T SRAM bit cell.

13. A method of assisting a memory read operation, the method comprising the steps of:
    detecting, during a memory read operation, whether a bit line coupled to a memory bit cell has a voltage below a predetermined threshold, to provide a detection signal; and
    pulling down the voltage of the bit line, if the detection signal indicates that the voltage of the bit line is below the predetermined threshold, during the memory read operation.

14. The method of claim 13, further comprising the steps of:
    sensing a logic state at the bit line responsive to assertion of a sense enable signal;
    wherein the detecting step includes:
        selectively conducting current from a first node to a second node having a logical high voltage value, to provide the detection signal at the logical high voltage value at the first node; and
        selectively providing an electrical path from the first node to a ground node based on a signal complementary to the sense enable signal, to provide the detection signal at a logical low voltage value at the first node.

15. The method of claim 13, wherein the detecting includes inverting a logic state corresponding to a voltage value of the bit line.

16. The method of claim 13, further comprising the step of sensing a logic state at the bit line responsive to assertion of a sense enable signal, wherein the pulling down the bit line is further based on the sense enable signal.

17. A memory comprising:
    a memory bit cell;
    a bit line coupled to the bit cell, the bit line configured to provide read access to a data bit stored at the bit cell; and
    an assist module including:
        a PMOS transistor including a gate terminal coupled to the bit line, and a source terminal coupled to an assist module power supply node;
        a first NMOS transistor including a gate terminal coupled to the bit line;
        a second NMOS transistor coupled between the PMOS transistor and the first NMOS transistor;
        a third NMOS transistor including a gate terminal coupled to a drain terminal of the PMOS transistor, and a drain terminal coupled to the bit line; and
        a fourth NMOS transistor including a drain terminal coupled to a source terminal of the third NMOS transistor; and
    a sense amplifier coupled to the bit line, the sense amplifier enabled by assertion of a sense enable signal;

wherein the fourth NMOS transistor is biased by the sense enable signal, and the second NMOS transistor is biased by a signal complementary to the sense enable signal.

18. The memory of claim 17, wherein:
the bit cell is powered by a power supply voltage;
a voltage at the assist module power supply node is greater than the power supply voltage; and
a body of the PMOS transistor is coupled to a voltage less than the power supply voltage.

19. The memory of claim 17, wherein the bit cell is a read only memory (ROM) bit cell.

20. The memory of claim 17, wherein the bit cell is a static random access memory (SRAM) bit cell.

* * * * *